(12) United States Patent
Naso et al.

(10) Patent No.: US 6,717,862 B2
(45) Date of Patent: Apr. 6, 2004

(54) FLASH MEMORY SECTOR TAGGING FOR CONSECUTIVE SECTOR ERASE OR BANK ERASE

(75) Inventors: Giovanni Naso, Frosinone (IT); Giovanni Santin, Santa Rufina (IT); Pasquale Pistilli, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,921

(22) Filed: Aug. 28, 2002

(65) Prior Publication Data

US 2003/0063500 A1 Apr. 3, 2003

(30) Foreign Application Priority Data

Aug. 31, 2001 (IT) .................................... RM2001A0530

(51) Int. Cl.$^7$ ............................................. G11C 16/04
(52) U.S. Cl. ........................... 365/185.33; 365/185.29; 365/185.11
(58) Field of Search ..................... 365/185.33, 185.29, 365/185.11, 185.23

(56) References Cited

U.S. PATENT DOCUMENTS

| | | | |
|---|---|---|---|
| 5,270,979 A | | 12/1993 | Harari et al. |
| 5,369,615 A | | 11/1994 | Harari et al. |
| 5,546,402 A | * | 8/1996 | Niijima et al. ......... 365/185.11 |
| 5,719,808 A | | 2/1998 | Harari et al. |
| 5,798,968 A | * | 8/1998 | Lee et al. .............. 365/185.33 |
| 5,974,499 A | | 10/1999 | Norman et al. |
| 5,999,446 A | | 12/1999 | Harari et al. |
| 6,002,152 A | | 12/1999 | Guterman et al. |
| 6,049,899 A | | 4/2000 | Auclair et al. |
| 6,055,184 A | | 4/2000 | Acharya et al. |
| 6,069,039 A | | 5/2000 | Lee et al. |
| 6,175,891 B1 | | 1/2001 | Norman et al. |
| 6,212,123 B1 | | 4/2001 | Norman et al. |

\* cited by examiner

*Primary Examiner*—Huan Hoang
(74) *Attorney, Agent, or Firm*—Leffert Jay & Polglaze, P.A.

(57) ABSTRACT

Methods and apparatus to facilitate erasure of multiple sectors of a memory device without the need for externally-supplied erase potentials are advantageous for device testing. During a scan of sector addresses, sector tagging blocks of a memory device provide an output signal to a write state machine indicating whether the addressed sector is tagged for erasure. The sector tagging blocks facilitate resetting of tags on a global basis and setting of tags on a single, bank-wide and/or global basis. Once initiated, the erase operation proceeds to erase each tagged sector of the memory device in sequence without the need for externally-supplied erase potentials and without the need for further direction of the tester hardware. The methods are particularly useful for erasing all sectors of a memory device or all sectors of one memory bank of the memory device.

26 Claims, 7 Drawing Sheets

FLASH MEMORY SECTOR TAGGING FOR CONSECUTIVE SECTOR ERASE OR BANK ERASE

RELATED APPLICATION

This application claims priority to Italian Patent Application Serial No. RM2001A000530 filed Aug. 31, 2001, which is commonly assigned.

TECHNICAL FIELD OF THE INVENTION

The present invention relates generally to semiconductor memory devices, and in particular, the present invention relates to sector tagging for erase operations in flash memory devices.

BACKGROUND OF THE INVENTION

Semiconductor memory devices are rapidly-accessible memory devices. In a semiconductor memory device, the time required for storing and retrieving information generally is independent of the physical location of the information within the memory device. Semiconductor memory devices typically store information in a large array of cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and power demands. Portable applications such as digital cameras, audio recorders, personal digital assistants (PDAs) and test equipment also use flash memory as a medium to store data.

Memory devices are usually tested as part of the manufacturing process, and may also be tested by original equipment manufacturers (OEMs) making use of the memory devices, to help insure their reliability. These tests are generally performed by dedicated testing equipment, or tester hardware, capable of testing and communicating with multiple memory devices to increase the number of devices that can be tested in a given period of time.

During testing, many aspects of memory device operation may be performed. Some aspects of operation may be tested in a manner that is inconsistent with typical device operation. One example is the ability of the memory device to perform erase operations on its memory cells. While such erase operations may be performed on only one block of memory cells during normal use of the device, the erase operation in testing may be performed on many more cells simultaneously, such as multiple blocks of memory cells. Erase operations during testing may even extend to simultaneously erasing the entire memory array.

The erase operation is often performed in this manner, i.e., many blocks in parallel, to reduce the amount of time required of the tester hardware. If the tests were not performed in this manner, the tester hardware would need to individually address each block of memory cells and initiate an erase operation. This would increase the demands on the processor of the tester hardware. By increasing the number of memory cells to be erased in one erase operation on a memory device, the tester hardware can more quickly move on to the next memory device, thereby reducing the amount of processor time necessary for testing each device. This permits the tester hardware to test more memory devices concurrently. However, it is noted that erasing large numbers of memory cells may require power levels that are beyond the capabilities of the on-chip charge pumps used to generate the erase potentials, thus necessitating the use of externally-supplied erase potentials.

For the reasons stated above, and for other reasons stated below which will become apparent to those skilled in the art upon reading and understanding the present specification, there is a need in the art for alternative methods and apparatus to aid in erasing portions of a flash memory device during testing.

SUMMARY OF THE INVENTION

The above-mentioned problems with memory devices and other problems are addressed by the present invention and will be understood by reading and studying the following specification.

Methods and apparatus are described to facilitate erasure of multiple sectors of a memory device during device testing without the need for externally-supplied erase potentials and with minimal involvement of the tester hardware. During a scan of sector addresses, sector tagging blocks of a memory device provide an output signal to a write state machine indicating whether the addressed sector is tagged for erasure. The sector tagging blocks facilitate resetting of tags on a global basis and setting of tags on a single, bank-wide and/or global basis. Once initiated, the erase operation proceeds to erase each tagged sector of the memory device without the need for externally-supplied erase potentials and without the need for further direction of the tester hardware. The methods are particularly useful for erasing all sectors of a memory device or all sectors of one memory bank of the memory device.

For one embodiment, the invention provides a flash memory device. The memory device includes an array of flash memory cells organized as a plurality of addressable sectors, control circuitry for controlling operations on the array of flash memory cells, and a plurality of sector tagging blocks, with each sector tagging block being associated with one sector of memory cells. Each sector tagging block includes a tag latch for latching a tag having a first logic level indicative of a tagged sector and a second logic level indicative of an untagged sector. Each sector tagging block is adapted to generate a select signal having a first logic level when its associated sector is addressed. The sector tagging blocks are further adapted to generate a common drain signal having a first logic level when any one of the associated sectors is tagged and addressed and to generate the common drain signal having a second logic level when no addressed associated sector is tagged.

For another embodiment, the invention provides a method of erasing portions of a flash memory device having addressable sectors. The method includes setting tags for a plurality of the sectors, sequentially addressing the sectors from a first sector address through a last sector address, and, for each addressed sector, determining whether the addressed sector is a tagged sector and erasing the addressed sector if it is a tagged sector.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Figure 1:
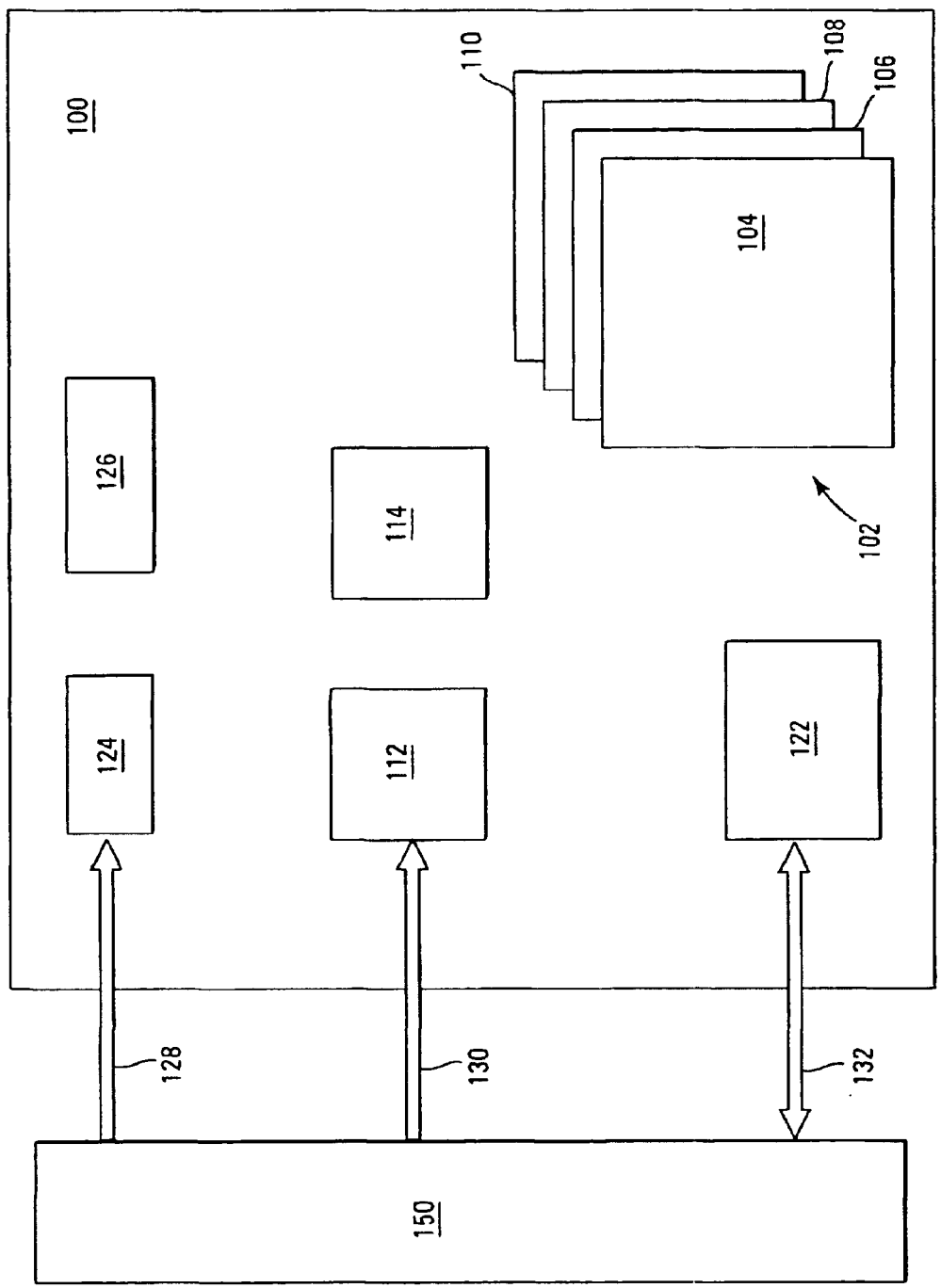
FIG. 1 is a functional block diagram of a basic flash memory device in accordance with an embodiment of the invention.

FIG. 1 is a functional block diagram of a basic flash memory device 100 in accordance with an embodiment of the invention. The memory device 100 includes an array of memory cells 102. The memory array 102 is arranged in a plurality of addressable banks. In one embodiment, the memory contains four memory banks 104, 106, 108 and 110. Each memory bank contains addressable rows and columns of memory cells organized as one or more sectors of memory cells, with each sector containing one or more blocks of memory cells and each block containing one or more rows of memory cells.

The data stored in the memory array 102 can be accessed using externally provided location addresses received by address register 112 via address signal connections 130. The address signals are decoded, and one or more target memory cells are selected in response to the decoded address signals, using decode and select circuitry 114.

Data is input and output through I/O circuit 122 via data connections 132. I/O circuit 122 includes data output registers, output drivers and output buffers. Command execution logic 124 is provided to control the basic operations of the memory device 100 in response to control signals received via control signal connections 128. A state machine 126 may also be provided to control specific operations performed on the memory array and cells. The command execution logic 124 and/or state machine 126 can be generally referred to as control circuitry to control read, write, erase and other memory operations. The control circuitry is adapted to facilitate the methods of the various embodiments. The data connections 132 are typically used for bi-directional data communication. The memory can be coupled to an external processor 150 for operation or for testing. Examples of a processor 150 include a memory controller in a personal computer and a processor of tester hardware.

It will be appreciated by those skilled in the art that additional circuitry and control signals can be provided, and that the memory device of FIG. 1 has been simplified to help focus on the invention. It will further be understood that the above description of a memory device is intended to provide a general understanding of the memory and is not a complete description of all the elements and features of a typical memory device.

Figure 2:
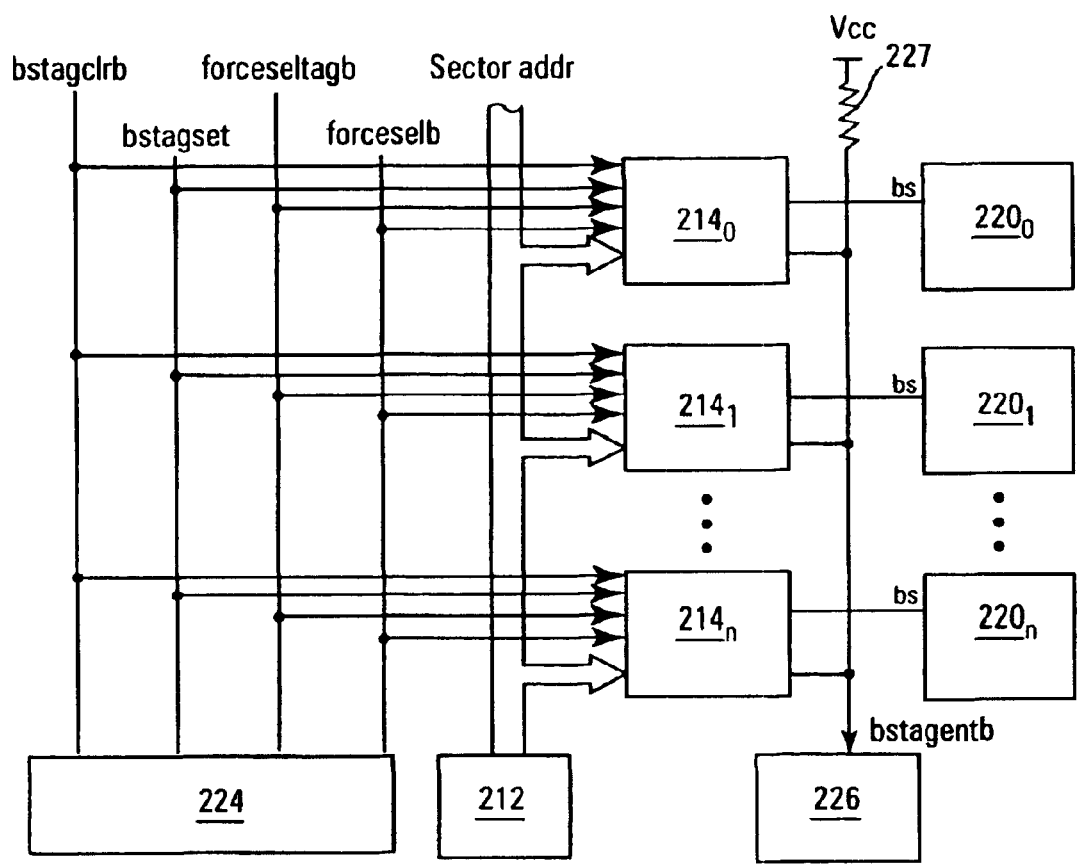
FIG. 2 is a schematic of a portion of a flash memory device in accordance with an embodiment of the invention.

FIG. 2 is a schematic of a portion of a flash memory device in accordance with an embodiment of the invention. Features of the system relating to sector tagging are typically unavailable to an end user of the memory device, but are instead activated primarily during testing of the memory device. FIG. 2 represents portions of the control circuitry as well as the decode and select circuitry of the memory device.

During testing of the memory device, tester hardware provides a command to place the memory device in a test mode to facilitate erasure of one or more sectors of the memory device. In the various embodiments, the test mode is capable of erasing multiple sectors of the memory device in response to a single command from the tester hardware. The command may be a control signal received on a device input that is unavailable to a device end user, a combination or sequence of control signals received by the device, a specific potential level received by the device that is outside its normal operating parameters, or it may be some combination of these to indicate that the test mode should be entered. Once the command is received from the tester hardware, the memory device will initiate the desired erase operation internally without need for further input by the tester hardware. The tester hardware is then free to initiate an erase operation on a next memory device. The tester hardware need only monitor a status bit on the data lines of the memory devices to determine when or if the erase operations are successfully completed for each device. The initiation of test modes within a memory device and the monitoring for completion of a test mode are well understood in the art and will not be detailed herein.

The memory device of FIG. 2 includes a test modes control logic block 224 that is generally part of the command execution logic of the memory device. The test modes control logic block 224 initiates the sector erase operation in response to a command from tester hardware. The test modes control logic block 224 is coupled to sector tagging blocks 214 for providing a variety of control signals (described later herein) to control operation of the test mode. The memory device further includes the address path 212 for communicating address signals to the sector tagging blocks 214. There is one sector tagging block 214 for each sector 220 of a memory array. Each sector tagging block 214 provides a control signal or select signal bs to its corresponding sector 220. The select signal is indicative of whether one or more blocks of a sector are targeted, e.g., selected to be read, erased or programmed. The select signal has a first logic level, such as logic high, to indicate that the sector is selected and a second logic level, such as logic low, to indicate that the sector is not selected. The sector tagging blocks 214 further provide a control signal or common drain signal bstagoutb to the write state machine 226. The common drain signal has a first logic level, such as logic high, to indicate that no sector is tagged, and a second logic level, such as logic low, to indicate that one or more sectors are tagged. For the embodiment shown in FIG. 2, the common drain signal is maintained at a supply potential, such as Vcc, through a pull-up resistor 227 unless pulled to a ground potential, such as Vss, by one or more of the sector tagging blocks 214.

The sector tagging blocks 214 generate the select signals bs in response to the address signals received from the address path 212 during normal operation. During a test mode in accordance with the embodiments of the invention, the sector tagging blocks 214 generate the select signals bs in response to some combination of the address signals received from the address path 212 and the control signals received from the test modes control logic block 224.

The various embodiments are capable of performing one or more erase operations in response to a single command from tester hardware. The various embodiments are at least capable of performing a consecutive sector erase operation or a bank erase operation. The various embodiments may be further capable of performing a parallel sector erase operation or a single sector erase operation.

In a consecutive sector erase operation, a number of sectors of the memory device are erased in sequence, or consecutively. Generally, all sectors of the memory device are tagged for erasure using the sector tagging blocks 214 in conjunction with the test modes control logic block 224 and in response to the command from the tester hardware. The write state machine 226 then scans the addresses of the memory device and erases all tagged sectors.

A bank erase operation is similar to a consecutive sector erase operation except that only those sectors in one bank of the memory array are erased. In a bank erase operation, the sectors within a back of the memory device are erased in sequence, or consecutively. Generally, all sectors of the memory bank are tagged for erasure using the sector tagging blocks 214 in conjunction with the test modes control logic block 224 and in response to the command from the tester hardware. The tagging status of sectors in other banks will remain unchanged. The write state machine 226 then scans the addresses of the memory device and erases all tagged sectors.

Embodiments of the sector tagging blocks 214 may further be adapted to remover tagging from all sectors of a memory device, or all sectors of a memory bank of the memory device, to reset the device for further testing.

During normal operation of the memory device, i.e., during use of the device rather than testing of the device, the sector tagging blocks 214 produce a select signal bs having a first logic level, such as logic high, when the address signal corresponds to the sector associated with the sector tagging block and a second logic level, such as logic low, when the address signal does not correspond the associated sector. Also during normal operation, the common drain signal bstagoutb is preferably maintained at the supply potential to reduce current draw through the pull-up resistor.

During a sector erase operation in accordance with an embodiment of the invention, the sector tagging blocks 214 produce the select signal bs as during normal operation. However, the common drain signal bstagoutb is pulled to the ground potential or a logic low level if one or more of the sectors have been tagged for erasure and is actively addressed, i.e., its select signal bs has its first logic level. The write state machine scans the sector addresses of the memory device and performs an erase operation on each addressed sector while the common drain signal bstagoutb maintains its logic low level. If no addressed sector is tagged, the common drain signal bstagoutb will be pulled back to the supply potential or a logic high level. While the common drain signal bstagoutb has the logic high level, the write state machine will not perform the erase operation on an addressed sector.

Figure 3:
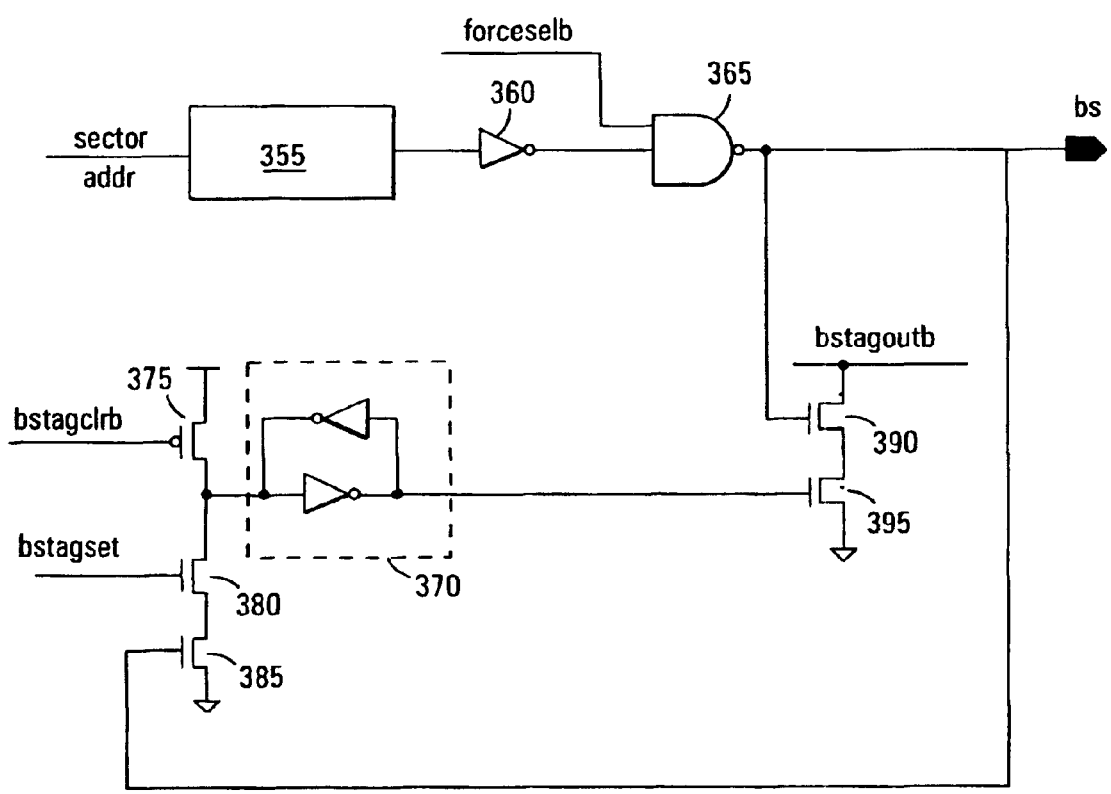
FIG. 3 is a schematic of a sector tagging block in accordance with one embodiment of the invention.

FIG. 3 is a schematic of a sector tagging block 214 in accordance with one embodiment of the invention. The sector tagging block 214 of FIG. 3 includes a sector decoder 355 for decoding the address signals to determine whether the associated sector is being addressed. The output of the sector decoder 355 is coupled to the input of an inverter 360 whose output is coupled to one input of the NAND gate 365. The other input of the NAND gate 365 is coupled to receive the control signal or force select signal forceselb. For one embodiment, the control signal forceselb is common to all sector tagging blocks 214. The control signal forceselb is normally logic high to permit the select signal bs to be responsive only to the decoded address signals and can be set to a logic low level to force the select signal bs to assume the logic high level. The NAND gate 365 generates the resulting select signal bs.

The sector tagging block 214 further includes a tag latch 370 for latching a tag indicative of whether the associated sector is tagged for erasure. The tag latch 370 may contain a pair of reverse-coupled inverters as shown in FIG. 3. The output of the tag latch 370 may be set to a logic low level in response to a control signal or clear signal bstagclrb. As one example, the clear signal bstagclrb is applied to a gate of a p-channel field-effect transistor (pFET) 375 having its source coupled to receive a supply potential and its drain coupled to the input of the tag latch 370. When the clear signal bstagclrb is set to a logic low level, the pFET 375 couples the input of the tag latch 370 to receive the supply potential. The tag clear signal bstagclrb is common to all sectors of the memory device.

To set the output of the tag latch 370 to a logic high level, the input of the tag latch 370 is pulled to the ground potential. As one example, the control signal or tag set signal bstagset is applied to a gate of an n-channel field-effect transistor (nFET) 380 and the select signal bs is applied to a gate of an nFET 385. When the tag set signal bstagset and the select signal bs are each set to a logic high level, the nFETs 380 and 385 couple the input of the tag latch 370 to receive the ground potential. The tag set signal bstagset is common to all sectors of the memory device.

To produce the common drain signal bstagoutb, a sector tagging block 214 pulls the common drain signal to the ground potential when the select signal bs has a logic level indicative of an addressed sector and when the output of the tag latch 370 has a logic level indicative of a tagged sector. As one example, the output of the tag latch 370 is indicative of a tagged sector when it has a logic high level. The common drain signal bstagoutb can then be coupled to a ground potential using nFETs 390 and 395, having their gates coupled to receive the select signal bs and the output of the tag latch 370, respectively. When both signals have a logic high level, the common drain signal is pulled to the ground potential.

To clear tags from all sectors using the embodiment of a sector tagging block 214 depicted in FIG. 3, the tag clear signal bstagclrb is set to a logic low level and the tag set signal bstagset is set to a logic low level. To set tags in all sectors using the embodiment of a sector tagging block 214 depicted in FIG. 3, the tag clear signal bstagclrb is set to a logic high level, the tag set signal bstagset is set to a logic high level and the force select signal forceselb is set to a logic low level. To set tags in only one sector, i.e., an addressed sector, the tag clear signal bstagclrb is set to a logic high level, the tag set signal bstagset is set to a logic high level and the force select signal forceselb is set to a logic high level. In this manner, the select signal bs only assumes the logic high level for the addressed sector.

Figure 4:
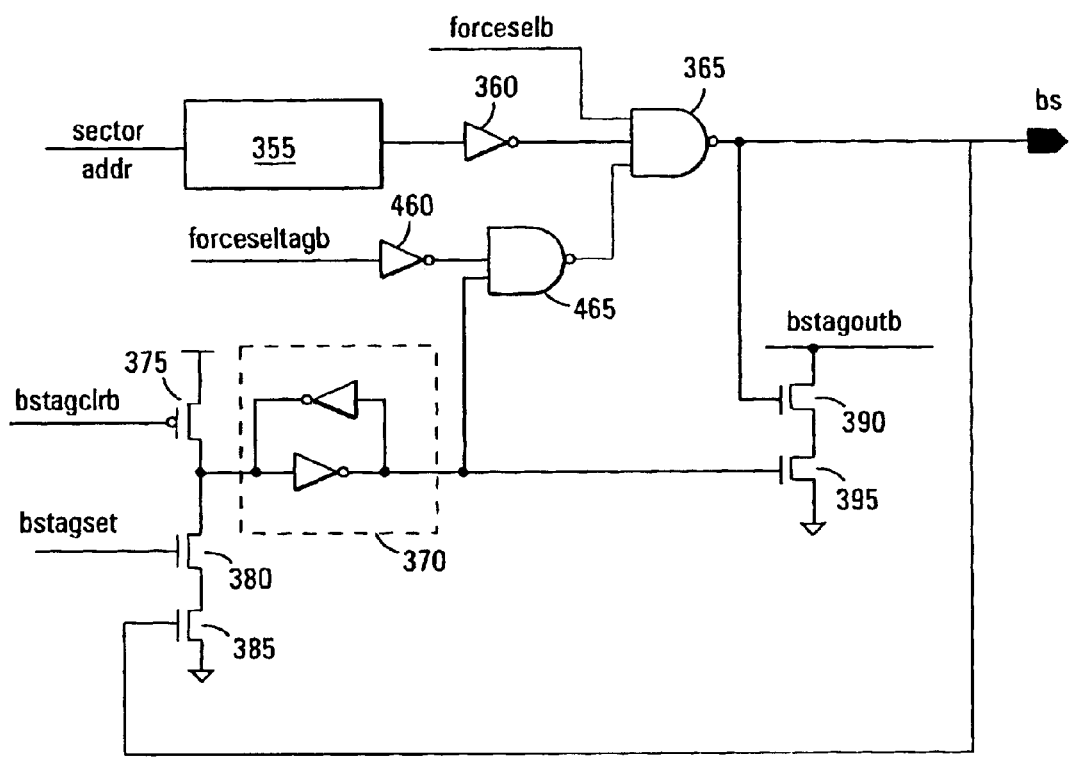
FIG. 4 is a schematic of a sector tagging block in accordance with another embodiment of the invention.

FIG. 4 is a schematic of a sector tagging block 214 in accordance with another embodiment of the invention. The sector tagging block 214 of FIG. 4 is a variation on the sector tagging block 214 of FIG. 3. In the embodiment of FIG. 4, the sector tagging block further includes logic to permit erasure of multiple sectors in parallel. To add this feature, the sector tagging block further includes a second NAND gate 465 having a first input coupled to the output of the tag latch 370 and a second input coupled to receive a control signal forceseltagb. For one embodiment, the control signal forceseltagb is inverted by inverter 460 interposed between second input of the NAND gate 465 and the control node providing the control signal forceseltagb. The output of the second NAND gate 465 is provided to a third input of the NAND gate 365. The control signal forceseltagb can thus be used to force the select signal bs to its logic high level when the associated sector has been tagged. This permits the activation of multiple sectors in parallel. For the example shown, the control signal forceseltagb is set to a logic high level for normal device operation or during consecutive sector erase operations, and to a logic low level when a parallel sector erase operation is preferred. Note that on-chip charge pumps used to generate erase potentials are generally incapable of handling the power requirements for simultaneously erasing multiple sectors. This embodiment is shown to demonstrate how the embodiments of the invention may be modified to permit parallel sector erase operations.

Figure 5:
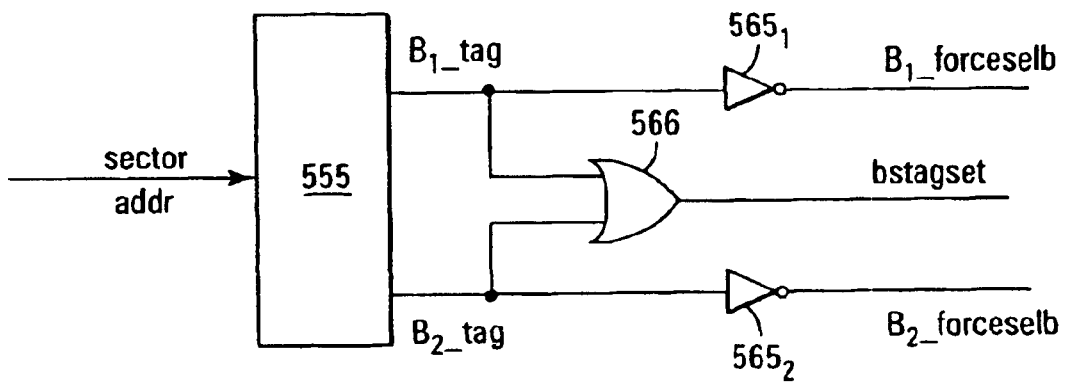
FIG. 5 is a schematic of a portion of the control circuitry of a memory device in accordance with an embodiment of the invention.

For another embodiment, each memory bank has its own force select signal forceselb, i.e., the force select signal is common only to those sectors within a given memory bank. In this manner, tagging of multiple sectors can be restricted to one memory bank of the memory device. Resetting tags for the memory device, however, can still be performed globally as the tag latch can be reset without regard to the force select signal. FIG. 5 is a schematic of a portion of the control circuitry of a memory device in accordance with an embodiment of the invention for generating a force select signal forceselb for each memory bank of the memory device as well as a global tag select signal bstagset. The schematic includes a decoder 555 for providing an output signal corresponding to each bank of the memory device and indicating which bank is selected. The schematic includes a first inverter 565$_1$ having an input for receiving a first control signal indicative of whether a first memory bank is selected and having an output for providing the force select signal forceselb for its associated memory bank. The schematic further includes a second inverter 565$_2$ having an input for receiving a second control signal indicative of whether a second memory bank is selected and having an output for providing the force select signal forceselb for its associated memory bank. The logic diagram further includes an OR gate 566 having a first input coupled to the input of the first inverter 565$_1$ and a second input coupled to the input of the second inverter 565$_2$. The output of the OR gate 566 provides the global tag set signal bstagset having a logic high level when any of the outputs of the bank decoder 555 have a logic high level and having a logic low level when all of the outputs of the bank decoder 555 have a logic low level. While the schematic of FIG. 5 depicts the logic for a memory device having two memory banks, the example can be extended to a memory device having any number of memory banks. For each case, the outputs of the bank decoder 555 may be inverted to produce the corresponding force select signals forceselb and the outputs may be ORed to produce the global tag select signal bstagset.

Figure 6:
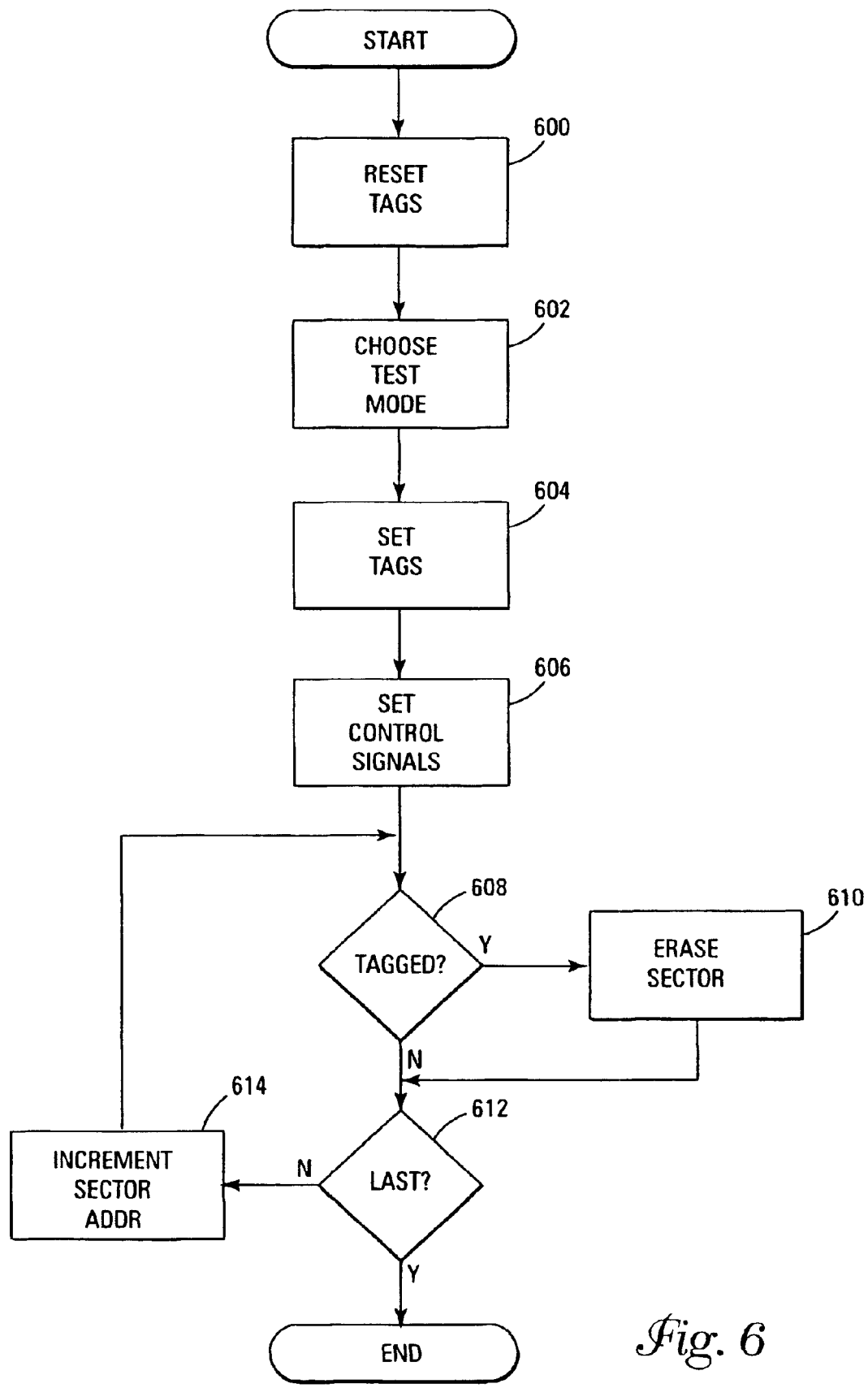
FIG. 6 is a flowchart of a sector erase operation in accordance with embodiments of the invention.

FIG. 6 is a flowchart of a sector erase operation in accordance with embodiments of the invention. The process begins with the optional reset of the tags for the sectors of the memory device at action box 600. Resetting the tags is preferred to avoid accidental erasure of a sector when less than all sectors are desired to be erased. As one example, where a bank erase test mode is desired, it is preferred that all tags be reset prior to setting the tags for the selected memory bank. For a consecutive sector erase test mode for erasing all sectors of the memory device, there is no need to reset the tags as all sectors are desired to be tagged.

The sector erase test mode is chosen in action box 602. The sector erase test mode may be a consecutive sector erase test mode or a bank erase test mode. The initiation of the test mode may include defining a starting sector address. While the starting sector address is preferably the first sector address, e.g., for erasing all tagged sectors, there is no requirement that the erase operation begin with the first sector of the memory device. Where some other starting sector address is desired, the starting sector address may be supplied by the tester hardware as part of the command initiating the sector erase operation. For a bank erase test mode, the starting sector address may be defined as the first sector address of the selected memory bank. Upon choosing the desire test mode, tags are set for desired sectors at action box 604. After the desired sectors have been tagged, the force select signal(s) are set to a logic high level at action box 606 to permit the select signal bs to be responsive to the address signal.

The common drain signal bstagoutb is checked at decision box 608. If it indicates that the addressed sector is tagged, an erase algorithm is applied to the addressed sector at action box 610. The erase algorithm may be the standard erase procedure performed by a write state machine. The various embodiments are not dependent upon a specific erase procedure. If the common drain signal bstagoutb indicates that the addressed sector is not tagged, no erase algorithm is performed, i.e., the memory cells in the addressed sector are left unchanged, and the sector address is checked at decision box 612 to determine whether the sector address represents the last sector, such as the last sector of the memory bank or memory device.

If the sector address is the last sector, the sector erase operation is complete. The status bit can be updated to indicate that the sector erase operation has been successfully completed and the tester hardware can poll this status bit to determine when the test mode is complete. If the sector address is not the last sector at decision box 612, the sector address is incremented at action box 614 and control returns to decision box 608 to determine the logic value of the common drain signal bstagoutb for the new sector address.

Figure 7:
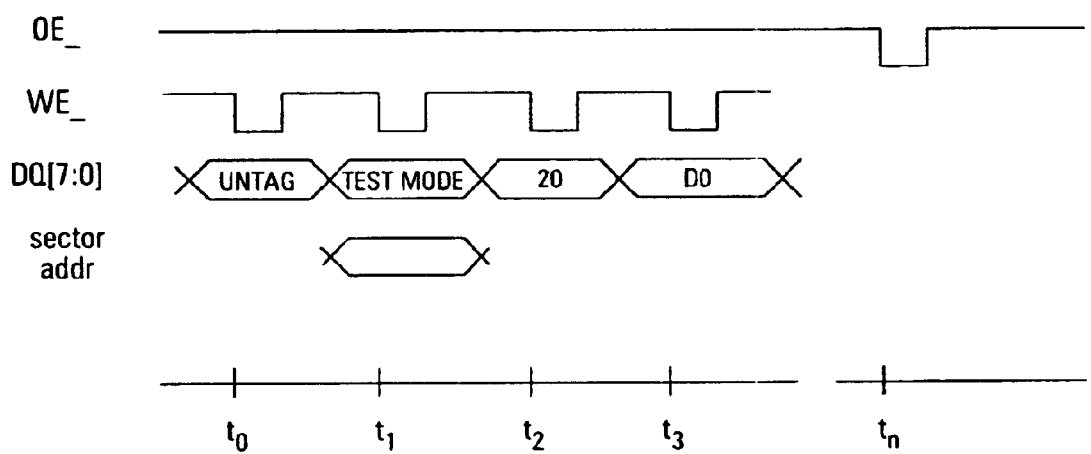
FIG. 7 is a timing diagram of a sector erase operation in accordance with an embodiment of the invention.

FIG. 7 is a timing diagram of a sector erase operation in accordance with an embodiment of the invention. The timing diagram of FIG. 7 includes receiving a first code at $t_0$ to initiate resetting of all sector tags, which is desirable for a bank erase test mode. For a consecutive sector erase test mode, the resetting of the sector tags may be eliminated, i.e., the timing diagram could begin at time $t_1$. At time $t_1$, a second code is received to set the desired sector tags. For a bank erase test mode, this includes all tags within one memory bank of the memory device. The selected memory bank may be indicated through the sector address also received at time $t_1$. For a consecutive sector erase test mode, the tags should be set for each sector of the memory device. The sector address received at time $t_1$ may be used to define the starting sector address.

One or more subsequent codes, e.g., hexadecimal codes 20 and D0 received at times $t_2$ and $t_3$, respectively, may be used to initiate the appropriate sector erase operation of the selected test mode. This completes the command sequence from the tester hardware. Subsequent performance of the sector erase operation is internal to the memory device. Upon completion, at time $t_n$, the status bit is updated for polling by the tester hardware to verify completion of the test mode.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

The foregoing figures were used to aid the understanding of the accompanying text. However, the figures are not drawn to scale and relative sizing of individual components are not necessarily indicative of the relative dimensions of such individual components in application. Accordingly, the drawings are not to be used for dimensional characterization.

CONCLUSION

Methods and apparatus have been described to facilitate erasure of multiple sectors of a memory device during device testing without the need for externally-supplied erase potentials and with minimal involvement of the tester hardware. During a scan of sector addresses, sector tagging blocks of a memory device provide an output signal to a write state machine indicating whether the addressed sector is tagged for erasure. The sector tagging blocks facilitate resetting of tags on a global basis and setting of tags on a single, bank-wide and/or global basis. Once initiated, the erase operation proceeds to erase each tagged sector of the memory device without the need for externally-supplied erase potentials and without the need for further direction of the tester hardware. The methods are particularly useful for erasing all sectors of a memory device or all sectors of one memory bank of the memory device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory device, comprising:
an array of flash memory cells organized as a plurality of addressable sectors;
control circuitry for controlling operations on the array of flash memory cells; and
a plurality of sector tagging blocks, with each sector tagging block being associated with one sector of memory cells;
wherein each sector tagging block comprises a tag latch for latching a tag having a first logic level indicative of a tagged sector and a second logic level indicative of an untagged sector;
wherein each sector tagging block is adapted to generate a select signal having a first logic level when its associated sector is addressed; and
wherein the plurality of sector tagging blocks is adapted to generate a common drain signal having a first logic level when any one of the associated sectors is tagged and addressed; and
wherein the plurality of sector tagging blocks is adapted to generate the common drain signal having a second logic level when no addressed associated sector is tagged.

2. The memory device of claim 1, wherein the control circuitry is adapted to erase an addressed sector of the memory device when the common drain signal has its first logic level.

3. The memory device of claim 1, wherein the control circuitry is adapted to scan addresses of the sectors and to erase each addressed sector of the memory device if the common drain signal has its first logic level when that sector is addressed.

4. The memory device of claim 3, wherein the control circuitry is further adapted to scan address of the sectors from a first sector address to a last sector address.

5. The memory device of claim 4, wherein the first sector address corresponds to a sector of the memory device other than a first sector of the memory device.

6. A flash memory device, comprising:
an array of flash memory cells organized as a plurality of addressable sectors;
control circuitry for controlling operations on the array of flash memory cells; and
a plurality of sector tagging blocks, wherein each sector tagging block is associated with one sector of memory cells and wherein each sector tagging block comprises:
an address decoder for receiving a sector address and generating a decoded address signal;
logic circuitry for generating a select signal at an output of the logic circuitry, wherein the select signal is generated in response to at least the decoded address signal;
a first field-effect transistor having a gate coupled to the output of the logic circuitry, a first source/drain region coupled to a first control signal node, and a second source/drain region;
a second field-effect transistor having a gate, a first source/drain region coupled to the second source/drain region of the first field-effect transistor, and a second source/drain region coupled to a first ground potential node;
a latch having an output coupled to the gate of the second field effect transistor and having an input;
a third field-effect transistor having a gate coupled to a second control signal node, a first source/drain region coupled to a supply potential node, and a second source/drain region coupled to the input of the latch;
a fourth field-effect transistor having a gate coupled to a third control signal node, a first source/drain region coupled to the input of the latch, and a second source/drain region; and
a fifth field-effect transistor having a gate coupled to the output of the logic circuitry, a first source/drain region coupled to the second source/drain region of the fourth field-effect transistor, and a second source/drain region coupled to a second ground potential node.

7. The memory device of claim 6, wherein the first, second, fourth and fifth field-effect transistors are n-channel field-effect transistors and the third field-effect transistor is a p-channel field-effect transistor.

8. The memory device of claim 6, wherein the latch further comprises a pair of reverse-coupled inverters.

9. A flash memory device, comprising:
   an array of flash memory cells organized as a plurality of addressable sectors;
   control circuitry for controlling operations on the array of flash memory cells; and
   a plurality of sector tagging blocks, wherein each sector tagging block is associated with one sector of memory cells and wherein each sector tagging block comprises:
      an address decoder for receiving a sector address on an input and generating a decoded address signal on an output;
      a first inverter having an input coupled to the output of the address decoder and having an output;
      a first NAND gate having a first input coupled to the output of the first inverter, a second input coupled to a first control signal node, and an output for providing a select signal;
      a first field-effect transistor having a gate coupled to the output of the first NAND gate, a first source/drain region coupled to a second control signal node, and a second source/drain region;
      a second field-effect transistor having a gate, a first source/drain region coupled to the second source/drain region of the first field-effect transistor, and a second source/drain region coupled to a first ground potential node;
      a latch having an output coupled to the gate of the second field effect transistor and having an input;
      a third field-effect transistor having a gate coupled to a third control signal node, a first source/drain region coupled to a supply potential node, and a second source/drain region coupled to the input of the latch;
      a fourth field-effect transistor having a gate coupled to a fourth control signal node, a first source/drain region coupled to the input of the latch, and a second source/drain region; and
      a fifth field-effect transistor having a gate coupled to the output of the first NAND gate, a first source/drain region coupled to the second source/drain region of the fourth field-effect transistor, and a second source/drain region coupled to a second ground potential node.

10. The flash memory device of claim 9, wherein each sector tagging block further comprises:
    a second inverter having an input coupled to a fifth control signal node and having an output;
    a second NAND gate having a first input coupled to the output of the second inverter, a second input coupled to the output of the latch, and an output coupled to a third input of the first NAND gate.

11. The flash memory device of claim 9, wherein the first control signal node is common to each sector of the array of flash memory cells.

12. The flash memory device of claim 9, wherein the array of flash memory cells is further organized as a plurality of addressable memory banks, each memory bank comprising a plurality of addressable sectors, and wherein each memory bank has a first control signal node common to only those sectors contained in that memory bank.

13. The flash memory device of claim 9, wherein the second control signal is adapted to be pulled up to a supply potential through a pull-up resistor when it is isolated from the first ground potential node.

14. The flash memory device of claim 13, wherein the second control signal node is pulled down toward a ground potential when it is coupled to the first ground potential node.

15. A method of erasing portions of a flash memory device having addressable sectors, the method comprising:
    setting tags for a plurality of the sectors, thereby generating a plurality of tagged sectors;
    sequentially addressing the sectors from a first sector address through a last sector address; and
    for each addressed sector, determining whether the addressed sector is a tagged sector and erasing the addressed sector if it is a tagged sector.

16. The method of claim 15, further comprising:
    resetting tags for each sector of the flash memory device prior to setting tags for a plurality of the sectors.

17. The method of claim 15, wherein the first sector address is an address corresponding to a first sector of the flash memory device.

18. The method of claim 15, wherein the sectors are organized into two or more addressable memory banks with each memory bank comprising two or more of the sectors, and wherein the first sector address is an address corresponding to a first sector of one of the memory banks.

19. The method of claim 18, wherein setting tags for a plurality of the sectors further comprises setting tags only for sectors of a selected one of the memory banks.

20. A method of erasing portions of a flash memory device having addressable sectors, the method comprising:
    setting tags for every sector of the memory device, thereby generating a plurality of tagged sectors;
    addressing a sector of the memory device having a first sector address;
    verifying that the addressed sector having the first sector address is a tagged sector and erasing that addressed sector in response to verifying that it is a tagged sector; and
    repeating until a last sector address is generated:
       incrementing the sector address, thereby generating a next sector address;
       addressing a sector of the memory device having the next sector address; and
       verifying that the addressed sector having the next sector address is a tagged sector and erasing that addressed sector in response to verifying that it is a tagged sector.

21. A method of erasing portions of a flash memory device having addressable sectors organized into two or more banks of memory cells, the method comprising:
    resetting tags for all of the sectors of the memory device, thereby generating a plurality of untagged sectors;
    setting tags for some portion of the untagged sectors of a selected one of the banks of memory cells, thereby generating a plurality of tagged sectors;
    addressing a sector of the memory device having a first sector address;
    determining whether the addressed sector having the first sector address is a tagged sector and erasing that addressed sector if it is a tagged sector; and repeating until a last sector address is generated:
incrementing the sector address, thereby generating a next sector address;
addressing a sector of the memory device having the next sector address; and
determining whether the addressed sector having the next sector address is a tagged sector and erasing that addressed sector if it is a tagged sector.

22. A method of erasing portions of a flash memory device having addressable sectors, the method comprising:
scanning addresses for the sectors of the memory device in sequence;
determining whether a sector of the memory device is tagged when it is addressed; and
erasing a sector of the memory device if it is tagged when it is addressed.

23. The method of claim 22, wherein scanning address for the sectors of the memory device in sequence further comprises scanning addresses from a first sector address through a last sector address.

24. The method of claim 23, wherein the first sector address corresponds to a first sector of the memory device.

25. The method of claim 23, wherein the last sector address corresponds to a last sector of the memory device.

26. The method of claim 23, wherein the first sector address corresponds to a first sector of a memory bank of the memory device, wherein the memory bank comprises more than one sector and less than all sectors of the memory device.

* * * * *

UNITED STATES PATENT AND TRADEMARK OFFICE
CERTIFICATE OF CORRECTION

PATENT NO.    : 6,717,862 B2
DATED         : April 6, 2004
INVENTOR(S)   : Naso

It is certified that error appears in the above-identified patent and that said Letters Patent is hereby corrected as shown below:

Title page,
Item [30], Foreign Application Priority Data, replace "RM2001A0530" with
-- RM2001A000530 --

Signed and Sealed this

Sixteenth Day of November, 2004

JON W. DUDAS
*Director of the United States Patent and Trademark Office*